(12) United States Patent
Hatanaka et al.

(10) Patent No.: US 6,937,532 B2
(45) Date of Patent: Aug. 30, 2005

(54) SEMICONDUCTOR MEMORY

(75) Inventors: Ichiro Hatanaka, Higashiosaka (JP);
Akinori Shibayama, Muko (JP);
Yoshinobu Yamagami, Nagaokakyo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 149 days.

(21) Appl. No.: 10/628,168

(22) Filed: Jul. 28, 2003

(65) Prior Publication Data
US 2004/0022098 A1 Feb. 5, 2004

(30) Foreign Application Priority Data
Jul. 29, 2002 (JP) .................................... 2002-220242

(51) Int. Cl.[7] .............................................. G11C 7/00
(52) U.S. Cl. ........................ 365/200; 365/51; 365/63
(58) Field of Search .......................... 365/51, 63, 200

(56) References Cited

U.S. PATENT DOCUMENTS

| | | | | |
|---|---|---|---|---|
| 5,355,339 A | * | 10/1994 | Oh et al. ................. | 365/200 |
| 5,479,371 A | * | 12/1995 | Ootani ..................... | 365/200 |
| 5,933,382 A | * | 8/1999 | Yi et al. .................. | 365/225.7 |
| 6,094,382 A | * | 7/2000 | Choi et al. ............... | 365/200 |
| 2001/0014030 A1 | | 8/2001 | Shimizu et al. | |

OTHER PUBLICATIONS

Hiroshi Shimizu et al., (1999), "A 1.4ns Access 700MHz 288kb SRAM Macro with Expandable architecture" in 1999 IEEE International Solid–State Circuits Conference, Session 11, Paper TA 11.1, pp. 190–191.

* cited by examiner

*Primary Examiner*—Son Mai
(74) *Attorney, Agent, or Firm*—Hamre, Schumann, Mueller & Larson P.C.

(57) ABSTRACT

A semiconductor memory includes a memory cell array, a redundancy repair signal generator, and a row decoder. The memory cell array includes a plurality of memory cell rows and at least one redundant memory cell row. The redundancy repair signal generator generates a redundancy repair signal that indicates an address of a defective memory cell row. The row decoder receives a row address signal that indicates a memory cell row including a memory cell to be accessed and selects the redundant memory cell row in accordance with the redundancy repair signal generated by the redundancy repair signal generator. The redundancy repair signal generator is located opposite to the row decoder with the memory cell array placed therebetween. This configuration can achieve a reduction in free space and thus a reduction in area loss.

11 Claims, 9 Drawing Sheets

SEMICONDUCTOR MEMORY

BACKGROUND OF THE INVENTION

1. Field of the Invention

The present invention relates to a semiconductor memory, and particularly a semiconductor memory that has the redundancy repair function for repairing a defective memory cell.

2. Description of the Related Art

Highly integrated semiconductor memories, such as a static random access memory (SRAM) and a dynamic random access memory (DRAM), include a redundancy repair circuit to improve manufacturing yields. When a defective memory cell is present in a memory cell array of a semiconductor memory manufactured, the memory cell row or column that includes the defective memory cell is replaced functionally by a predetermined spare redundant memory cell row or column. This replacement of the memory cell row or column that includes a defective memory cell by the redundant memory cell row or column is known as redundancy repair function and can be used in general semiconductor memories such as SRAM and DRAM. The following is an explanation of an example of SRAM having the redundancy repair function.

FIG. 8 is a block diagram showing the configuration of a conventional semiconductor memory 90. The semiconductor memory 90 is formed as a SRAM. In FIG. 8, the SRAM includes a row redundancy repair signal generator 1 that generates a redundancy repair signal in accordance with the recorded information of a defective memory cell address by selectively disconnecting fuses.

The semiconductor memory 90 is provided with a SRAM macro 80. The SRAM macro 80 includes a memory cell array 2. The memory cell array 2 includes n (n is an integer not less than 2) memory cell rows, and each of the memory cell rows includes m (m is an integer not less than 2) memory cells 4 arranged in the row direction at predetermined intervals. The memory cell array 2 also includes at least one redundant memory cell row 7 for repairing a defective memory cell row of the n memory cell rows that includes a defective memory cell 5, and the redundant memory cell row 7 includes m redundant memory cells 6 arranged in the row direction at predetermined intervals.

In the memory cell array 2, n word lines WLa(0), . . . , WLa(n−1) are arranged in the row direction for each of the n memory cell rows, and at least one word line WLa(r) (r is an integer not less than 1) is arranged in the row direction for each of the at least one redundant memory cell row 7.

In the memory cell array 2, m complementary bit line pairs BLa(0)/NBLa(0), . . . , BLa(m−1)/NBLa(m−1) are arranged in the column direction for each of the m memory cell columns.

The row redundancy repair signal generator 1 is located next to the SRAM macro 80 and includes a plurality of fuses (not shown) that are disconnected selectively to store the address of the defective memory cell 5. According to the address stored in the fuses, the row redundancy repair signal generator 1 generates a redundancy repair signal that indicates the address of a defective memory cell row including the defective memory cell 5.

In the SRAM macro 80, a row decoder 3 is located between the memory cell array 2 and the row redundancy repair signal generator 1. The row decoder 3 receives a row address signal that indicates a memory cell row including a memory cell to be accessed and selects the word line WLa(r) in accordance with the redundancy repair signal generated by the row redundancy repair signal generator 1.

The SRAM macro 80 includes a data I/O circuit 12. The data I/O circuit 12 is provided with a column decoder 9. The column decoder 9 selects any of the complementary bit line pairs BLa(0)/NBLa(0), . . . , BLa(m−1)/NBLa(m−1) in accordance with a column address signal that indicates a memory cell column including a memory cell to be accessed. The data I/O circuit 12 writes data into a memory cell selected by the row decoder 3 and the column decoder 9 or reads data from the selected memory cell.

The SRAM macro 80 includes a control circuit 11. The control circuit 11 controls the operations of the row decoder 3 and the data I/O circuit 12 provided with the column decoder 9.

The operations of the semiconductor memory 90 having the above configuration will be described. First, the following is an explanation of the operation in which a non-defective memory cell 4 is specified by an externally input row address signal and column address signal.

Upon receiving a row address signal, the row decoder 3 selects a word line WLa(j) for the non-defective memory cell 4 in accordance with the row address signal. The memory cell 4 that corresponds to the word line WLa(j) is connected electrically to a bit line pair BLa(i)/NBLa(i). The column decoder 9 selects the bit line pair BLa(i)/NBLa(i) for the memory cell 4 in accordance with an externally input column address signal. Therefore, the bit line pair BLa(i)/NBLa(i) is connected electrically to the memory cell 4 and the data I/O circuit 12.

For a writing operation, data is input externally to the data I/O circuit 12, transferred through the bit line pair BLa(i)/NBLa(i), and written into the memory cell 4. For a reading operation, the stored data is read from the memory cell 4, transferred through the bit line pair BLa(i)/NBLa(i), and output from the data I/O circuit 12.

Next, the following is an explanation of the operation in which the defective memory cell 5 is specified by an externally input row address signal and column address signal.

Upon receiving a row address signal specifying the defective memory cell 5, the row decoder 3 compares the address indicated by the row address signal with the address of a defective memory cell row including the defective memory cell 5, which is indicated by the redundancy repair signal from the row redundancy repair signal generator 1. The two addresses are matched, so that the row decoder 3 selects the word line WLa(r) for the redundant memory cell 6 instead of the word line WLa(k) for the defective memory cell 5. This functional replacement of the defective memory cell row (including the defective memory cell 5) by the redundant memory cell row 7 (including the redundant memory cell 6) can repair the defective memory cell 5.

FIG. 9 is a block diagram showing the configuration of another conventional semiconductor memory 90A. The identical elements to those of the semiconductor memory 90 in FIG. 8 are denoted by the same reference numerals, and a detailed description will not be repeated. The semiconductor memory 90A differs from the semiconductor memory 90 in that the memory cell array 2 is divided into two memory cell arrays 2A, a row decoder 3 is located between the memory cell arrays 2A, and a row redundancy repair signal generator 1 is located opposite to the memory cell arrays 2A and the row decoder 3.

The semiconductor memory 90A is provided with a SRAM macro 80A. The SRAM macro 80A includes the two memory cell arrays 2A. The row decoder 3 is located between the memory cell arrays 2A. The row redundancy repair signal generator 1 is located outside the SRAM macro 80 and opposite to the row decoder 3 and the memory cell arrays 2A.

The SRAM macro 80A includes two data I/O circuits 12 that face the respective memory cell arrays 2A. Each of the data I/O circuits 12 is provided with a column decoder 9. A control circuit 11 is located between the data I/O circuits 12.

For a mass-storage SRAM, many memory cells are arranged in the direction of each memory cell row. Therefore, the word lines extending along the memory cell rows become longer, and a wiring load of the word lines is increased. This causes delay in signal transfer through the word lines, so that the operating speed required for access to a memory cell is decreased.

As shown in FIG. 9, when a memory cell array is divided into two memory cell arrays 2A, and the row decoder 3 is located between the memory cell arrays 2A, the word line length is reduced by half. Accordingly, this configuration can reduce the signal delay caused by an increase in wiring load of longer word lines.

The fuses provided in the row redundancy repair signal generator 1 are disconnected by a laser or the like. Therefore, it is not possible to form the signal wiring on the fuses. When the row redundancy repair signal generator 1 in FIG. 9 is located inside the SRAM macro 80A, the signal wiring should be arranged so as to avoid a region including the fuses, and thus the fuses interfere with the signal wiring. For this reason, the row redundancy repair signal generator 1 having the fuses is not located inside, but outside the SRAM macro 80A, as shown in FIG. 9.

The configuration that can achieve more flexibility in wiring of the word lines of a SRAM macro is disclosed by H. Shimizu et al., "A 1.4 ns Access 700 MHz 288 kb SRAM Macro with Expandable Architecture" ISSCC Digest of Technical Papers, pp. 190–191, February 1999.

As described above, however, the mass-storage SRAM includes many memory cells arranged in the direction of each memory cell row. Therefore, the lateral lengths of the individual memory cell arrays 2A are increased, so that a larger free space is formed on the right and left sides of the row redundancy repair signal generator 1 of the semiconductor memory 90A in FIG. 9.

In the configuration disclosed by the above document, a redundancy repair signal generator including fuses is separated from a SRAM macro and located at the periphery of a chip, and a signal line that connects the SRAM macro and the redundancy repair signal generator is necessary. Therefore, this configuration causes an area loss over the entire chip.

SUMMARY OF THE INVENTION

Therefore, with the foregoing in mind, it is an object of the present invention to provide a semiconductor memory that can achieve a reduction in free space and thus a reduction in area loss.

It is another object of the present invention to provide a semiconductor memory including a redundancy repair signal generator that is located so as not to impose any constraint on the wiring of word lines in the SRAM macro.

A semiconductor memory of the present invention includes a memory cell array, a redundancy repair signal generator, and a row decoder. The memory cell array includes a plurality of memory cell rows and at least one redundant memory cell row for repairing a defective memory cell row of the memory cell rows that includes a defective memory cell. Each of the memory cell rows includes a plurality of memory cells arranged in a row direction. The at least one redundant memory cell row includes a plurality of redundant memory cells arranged in the row direction. The redundancy repair signal generator generates a redundancy repair signal that indicates the address of the defective memory cell row. The row decoder receives a row address signal that indicates a memory cell row including a memory cell to be accessed and selects the redundant memory cell row in accordance with the redundancy repair signal generated by the redundancy repair signal generator. The redundancy repair signal generator is located opposite to the row decoder with the memory cell array sandwiched between the row decoder and the redundancy repair signal generator.

Another semiconductor memory of the present invention includes first and second memory cell arrays, a redundancy repair signal generator, and a row decoder. Each of the first and second memory cell arrays includes a plurality of memory cell rows and at least one redundant memory cell row for repairing a defective memory cell row of the memory cell rows that includes a defective memory cell. Each of the memory cell rows includes a plurality of memory cells arranged in a row direction. The at least one redundant memory cell row includes a plurality of redundant memory cells arranged in the row direction. The redundancy repair signal generator generates a redundancy repair signal that indicates the address of the defective memory cell row. The row decoder receives a row address signal that indicates a memory cell row including a memory cell to be accessed and selects the redundant memory cell row in accordance with the redundancy repair signal generated by the redundancy repair signal generator. The row decoder is located between the first memory cell array and the second memory cell array. The redundancy repair signal generator is located opposite to the row decoder with the first memory cell array sandwiched between the row decoder and the redundancy repair signal generator.

Still another semiconductor memory of the present invention includes a memory cell array, a first redundancy repair signal generator, a row decoder, a second redundancy repair signal generator, and a column decoder. The memory cell array includes a plurality of memory cell rows, at least one redundant memory cell row for repairing a defective memory cell row of the memory cell rows that includes a defective memory cell, and at least one redundant memory cell column for repairing a defective memory cell column of a plurality of memory cell columns that includes the defective memory cell. Each of the memory cell rows includes a plurality of memory cells arranged in a row direction. The at least one redundant memory cell row includes a plurality of redundant memory cells arranged in the row direction. The at least one redundant memory cell column includes a plurality of redundant memory cells arranged in a column direction. The first redundancy repair signal generator generates a first redundancy repair signal that indicates the address of the defective memory cell row. The row decoder receives a row address signal that indicates a memory cell row including a memory cell to be accessed and selects the redundant memory cell row in accordance with the first redundancy repair signal generated by the first redundancy repair signal generator. The second redundancy repair signal generator generates a second redundancy repair signal that indicates the address of the defective memory cell column. The column decoder receives a column address signal that indicates a memory cell column including the memory cell to be accessed and selects the redundant memory cell column in accordance with the second redundancy repair signal generated by the second redundancy repair signal generator. The first redundancy repair signal generator is located opposite to the row decoder with the memory cell array sandwiched between the row decoder and the first redundancy repair signal generator. The second redundancy repair signal generator is located opposite to the column decoder with the memory cell array sandwiched between the column decoder and the second redundancy repair signal generator.

Still another semiconductor memory of the present invention includes first, second, third, and fourth memory cell arrays, first and second row redundancy repair signal generators, first and second row decoders, first and second column redundancy repair signal generators, and first and second column decoders. Each of the first, second, third, and fourth memory cell arrays includes a plurality of memory cell rows, at least one redundant memory cell row for repairing a defective memory cell row of the memory cell rows that includes a defective memory cell, and at least one redundant memory cell column for repairing a defective memory cell column of a plurality of memory cell columns that includes the defective memory cell. Each of the memory cell rows includes a plurality of memory cells arranged in a row direction. The at least one redundant memory cell row includes a plurality of redundant memory cells arranged in the row direction. The at least one redundant memory cell column includes a plurality of redundant memory cells arranged in a column direction. The first and second row redundancy repair signal generators generate first and second row redundancy repair signals, respectively. Each of the first and second row redundancy repair signals indicates the address of the defective memory cell row. The first and second row decoders receive a row address signal that indicates a memory cell row including a memory cell to be accessed and select the redundant memory cell row respectively in accordance with the first and second row redundancy repair signals generated by the first and second row redundancy repair signal generators. The first and second column redundancy repair signal generators generate first and second column redundancy repair signals, respectively. Each of the first and second column redundancy repair signals indicates the address of the defective memory cell column. The first and second column decoders receive a column address signal that indicates a memory cell column including the memory cell to be accessed and selects the redundant memory cell column respectively in accordance with the first and second column redundancy repair signals generated by the first and second column redundancy repair signal generators. The first row decoder is located between the first memory cell array and the second memory cell array that are arranged in the row direction. The second row decoder is located between the third memory cell array and the fourth memory cell array that are arranged in the row direction. The first column decoder is located between the first memory cell array and the third memory cell array that are arranged in the column direction. The second column decoder is located between the second memory cell array and the fourth memory cell array that are arranged in the column direction. The first row redundancy repair signal generator is located opposite to the first row decoder with the first memory cell array sandwiched between the first row decoder and the first row redundancy repair signal generator. The second row redundancy repair signal generator is located opposite to the second row decoder with the third memory cell array sandwiched between the second row decoder and the second row redundancy repair signal generator. The first column redundancy repair signal generator is located opposite to the first column decoder with the first memory cell array sandwiched between the first column decoder and the first column redundancy repair signal generator. The second column redundancy repair signal generator is located opposite to the second column decoder with the second memory cell array sandwiched between the second column decoder and the second column redundancy repair signal generator.

Still another semiconductor memory of the present invention includes first and second memory cell arrays, first and second redundancy repair signal generators, and first and second row decoders. Each of the first and second memory cell arrays includes a plurality of memory cell rows and at least one redundant memory cell row for repairing a defective memory cell row of the memory cell rows that includes a defective memory cell. Each of the memory cell rows includes a plurality of memory cells arranged in a row direction. The at least one redundant memory cell row includes a plurality of redundant memory cells arranged in the row direction. The first redundancy repair signal generator generates a first redundancy repair signal that indicates the address of the defective memory cell row of the first memory cell array. The second redundancy repair signal generator generates a second redundancy repair signal that indicates the address of the defective memory cell row of the second memory cell array. The first row decoder receives a row address signal that indicates a memory cell row including a memory cell to be accessed and selects the redundant memory cell row of the first memory cell array in accordance with the first redundancy repair signal generated by the first redundancy repair signal generator. The second row decoder receives the row address signal and selects the redundant memory cell row of the second memory cell array in accordance with the second redundancy repair signal generated by the second redundancy repair signal generator. The first and second redundancy repair signal generators are located between the first memory cell array and the second memory cell array. The first row decoder is located opposite to the first redundancy repair signal generator with the first memory cell array sandwiched between the first row decoder and the first row redundancy repair signal generator. The second row decoder is located opposite to the second redundancy repair signal generator with the second memory cell array sandwiched between the second row decoder and the second redundancy repair signal generator.

Still another semiconductor memory of the present invention includes first and second memory cell arrays, a redundancy repair signal generator, and first and second row decoders. Each of the first and second memory cell arrays includes a plurality of memory cell rows and at least one redundant memory cell row for repairing a defective memory cell row of the memory cell rows that includes a defective memory cell. Each of the memory cell rows includes a plurality of memory cells arranged in a row direction. The at least one redundant memory cell row includes a plurality of redundant memory cells arranged in the row direction. The redundancy repair signal generator generates a first redundancy repair signal that indicates the address of the defective memory cell row of the first memory cell array and a second redundancy repair signal that indicates the address of the defective memory cell row of the second memory cell array. The first row decoder receives a row address signal that indicates a memory cell row including a memory cell to be accessed and selects the redundant memory cell row of the first memory cell array in accordance with the first redundancy repair signal generated by the redundancy repair signal generator. The second row decoder receives the row address signal and selects the redundant memory cell row of the second memory cell array in accordance with the second redundancy repair signal generated by the redundancy repair signal generator. The redundancy repair signal generator is located between the first memory cell array and the second memory cell array. The first row decoder is located opposite to the redundancy repair signal generator with the first memory cell array sandwiched between the first row decoder and the redundancy repair signal generator. The second row decoder is located opposite to the redundancy repair signal generator with the second memory cell array sandwiched between the second row decoder and the redundancy repair signal generator.

Still another semiconductor memory of the present invention includes first and second memory cell arrays, a redundancy repair signal generator, and first and second row decoders. Each of the first and second memory cell arrays includes a plurality of memory cell rows and at least one redundant memory cell row for repairing a defective memory cell row of the memory cell rows that includes a defective memory cell. Each of the memory cell rows includes a plurality of memory cells arranged in a row direction. The at least one redundant memory cell row includes a plurality of redundant memory cells arranged in the row direction. The redundancy repair signal generator generates a first redundancy repair signal that indicates the address of the defective memory cell row of the first memory cell array and a second redundancy repair signal that indicates the address of the defective memory cell row of the second memory cell array. The first row decoder receives a row address signal that indicates a memory cell row including a memory cell to be accessed and selects the redundant memory cell row of the first memory cell array in accordance with the first redundancy repair signal generated by the redundancy repair signal generator. The second row decoder receives the row address signal and selects the redundant memory cell row of the second memory cell array in accordance with the second redundancy repair signal generated by the redundancy repair signal generator. The redundancy repair signal generator is located between the first memory cell array and the second memory cell array. The first row decoder is located between the first memory cell array and the redundancy repair signal generator. The second row decoder is located between the second memory cell array and the redundancy repair signal generator.

Still another semiconductor memory of the present invention includes first and second memory cell arrays, a redundancy repair signal generator, and a column decoder. Each of the first and second memory cell arrays includes a plurality of memory cell columns and at least one redundant memory cell column for repairing a defective memory cell column of the memory cell columns that includes a defective memory cell. Each of the memory cell columns includes a plurality of memory cells arranged in a column direction. The at least one redundant memory cell column includes a plurality of redundant memory cells arranged in the column direction. The redundancy repair signal generator generates a redundancy repair signal that indicates the address of the defective memory cell column. The column decoder receives a column address signal that indicates a memory cell column including a memory cell to be accessed and selects the redundant memory cell column in accordance with the redundancy repair signal generated by the redundancy repair signal generator. The column decoder is located between the first memory cell array and the second memory cell array. The redundancy repair signal generator is located opposite to the column decoder with the first memory cell array sandwiched between the column decoder and the redundancy repair signal generator.

DETAILED DESCRIPTION

Figure 1:
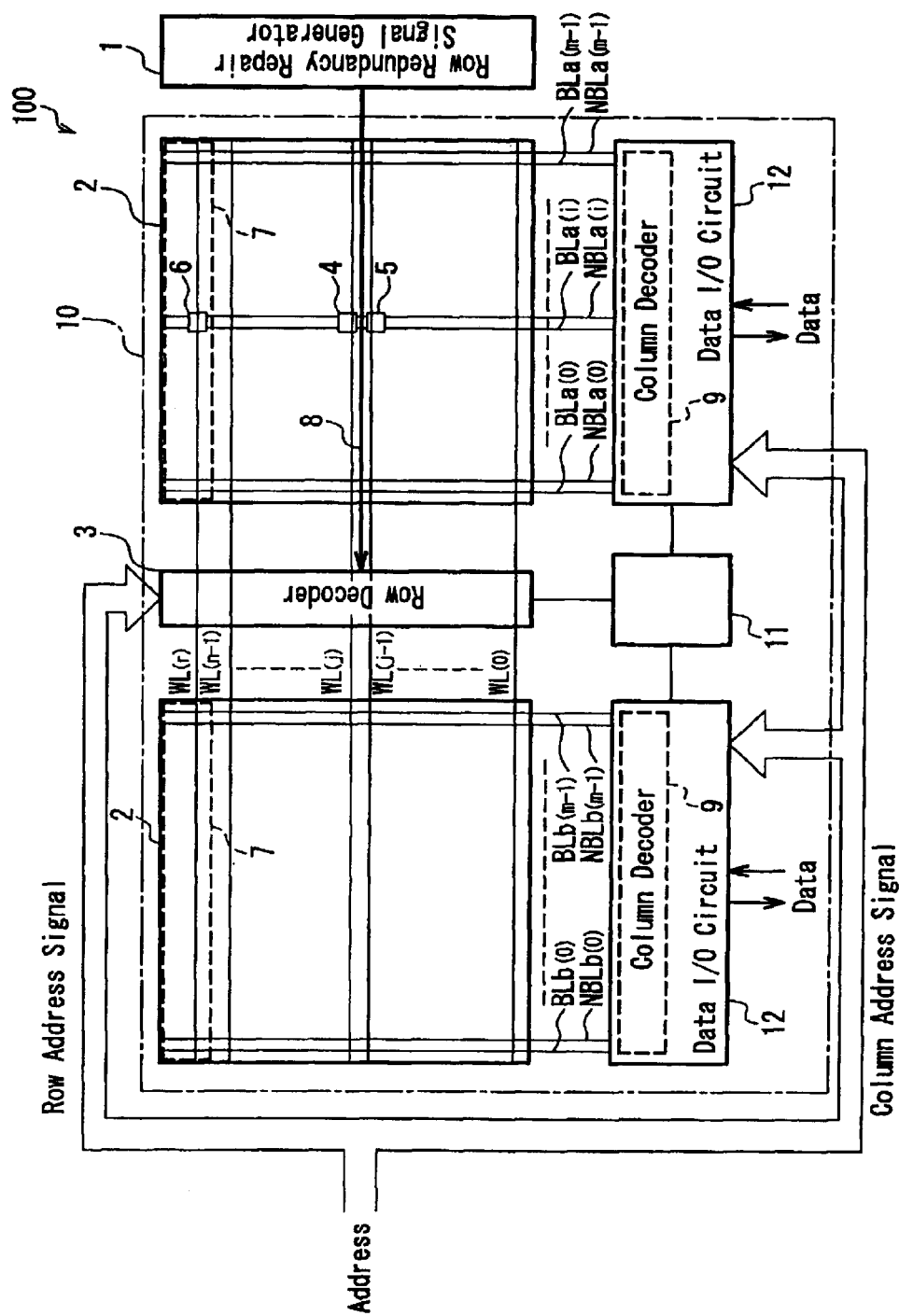
FIG. 1 is a block diagram showing the configuration of a semiconductor memory of Embodiment 1.

In a semiconductor memory of the present embodiment, the redundancy repair signal generator is located opposite to the row decoder with the memory cell array sandwiched therebetween. Accordingly, the semiconductor memory can reduce an area loss caused by the location of the redundancy repair signal generator.

It is preferable that a redundancy repair signal line for supplying the redundancy repair signal to the row decoder is arranged between the row decoder and the redundancy repair signal generator and extends across the memory cell array. This configuration can reduce an area loss caused by the wiring of the redundancy repair signal line.

It is preferable that the semiconductor memory further includes a plurality of word lines arranged in the row direction for each of the memory cell rows so that the row decoder selects one row of the memory cell rows in accordance with the row address signal, and that the redundancy repair signal line is located between adjacent word lines of the word lines. This configuration allows the adjacent word lines to be shielded from each other by the redundancy repair signal line.

It is preferable that the redundancy repair signal line and the word lines are formed in the same wiring layer. This configuration can further increase the shielding effect of adjacent word lines.

It is preferable that the semiconductor memory cell is formed as a static random access memory (SRAM), the memory cell array and the row decoder are located inside a SRAM macro, and the redundancy repair signal generator is located outside the SRAM macro. The redundancy repair signal generator includes a fuse region that may interfere with wiring. Since the redundancy repair signal generator is located outside the SRAM macro, there is no constraint on the signal wiring in the SRAM macro.

It is preferable that the row decoder selects the redundant memory cell row when the address indicated by the row address signal is matched with the address of the defective memory cell row indicated by the redundancy repair signal. This can prevent access to the defective memory cell.

It is preferable that the memory cell array is rectangular in shape, the row decoder faces one side of the memory cell array in the column direction, and the redundancy repair signal generator faces the other side of the memory cell array in the column direction. This configuration effectively can reduce an area loss caused by the location of the redundancy repair signal generator.

It is preferable that the memory cells and the redundant memory cells are arranged in matrix form, and the semiconductor memory further includes a column decoder for receiving a column address signal that indicates a memory cell column including the memory cell to be accessed and selecting the memory cell column indicated by the column address signal. This makes it possible to select the memory cell to be accessed by a simple configuration.

Hereinafter, embodiments of the present invention will be described with reference to the drawings.

Embodiment 1

FIG. 1 is a block diagram showing the configuration of a semiconductor memory 100 of Embodiment 1. The semiconductor memory 100 is formed as a SRAM and provided with a SRAM macro 10. The SRAM macro 10 includes two memory cell arrays 2 that are substantially rectangular in shape.

Each of the memory cell arrays 2 includes n (n is an integer not less than 2) memory cell rows, and each of the memory cell rows includes m (m is an integer not less than 2) memory cells 4 arranged in the row direction. Each of the memory cell arrays 2 also includes at least one redundant memory cell row 7 for repairing a defective memory cell row of the n memory cell rows that includes a defective memory cell 5, and the redundant memory cell row 7 includes m redundant memory cells 6 arranged in the row direction.

A row decoder 3 is located between the memory cell arrays 2 with one side facing one memory cell array 2 and the other side facing the other memory cell array 2.

In the SRAM macro 10, n word lines WL(0), . . . , WL(n−1) are arranged in the row direction for each of the n memory cell rows of the memory cell arrays 2 and extend across one memory cell array 2, the row decoder 3, and the other memory cell array 2. Moreover, at least one word line WL(r) (r is an integer not less than 1) is arranged in the row direction for each of the at least one redundant memory cell row 7 of the memory cell arrays 2 and extends across one memory cell array 2, the row decoder 3, and the other memory cell array 2.

In one memory cell array 2, m complementary bit line pairs BLa(0)/NBLa(0), . . . , BLa(m−1)/NBLa(m−1) are arranged in the column direction for each of the m memory cell columns. In the other memory cell array 2, m complementary bit line pairs BLb(0)/NBLb(0), . . . , BLb(m−1)/NBLb(m−1) are arranged in the column direction for each of the m memory cell columns.

The semiconductor memory 100 includes a row redundancy repair signal generator 1. The row redundancy repair signal generator 1 is located outside the SRAM macro 10 and opposite to the row decoder 3 with one memory cell array 2 sandwiched between the row decoder 3 and the row redundancy repair signal generator 1. The row redundancy repair signal generator 1 includes a plurality of fuses (not shown) that are disconnected selectively to store the address of the defective memory cell 5. According to the address stored in the fuses, the row redundancy repair signal generator 1 generates a redundancy repair signal that indicates the address of a defective memory cell row including the defective memory cell 5.

A redundancy repair signal line 8 for supplying the redundancy repair signal to the row decoder 3 is arranged between the row decoder 3 and the row redundancy repair signal generator 1 and extends across one memory cell array 2. The redundancy repair signal line 8 is located between adjacent word lines WL(j) and WL(j−1). The redundancy repair signal line 8 and a word line WL(0) through WL(n−1) are formed in the same wiring layer.

The row decoder 3 receives a row address signal that indicates a memory cell row including a memory cell to be accessed and selects a word line WL(r) in accordance with the redundancy repair signal generated by the row redundancy repair signal generator 1.

The SRAM macro 10 includes two data I/O circuits 12 that face the respective memory cell arrays. Each of the data I/O circuits 12 is provided with a column decoder 9. The column decoder 9 facing one memory cell array 2 selects any of the complementary bit line pairs BLa(0)/NBLa(0), . . . , BLa(m−1)/NBLa(m−1) in accordance with a column address signal that indicates a memory cell column including a memory cell to be accessed. The column decoder 9 facing the other memory cell array 2 selects any of the complementary bit line pairs BLb(0)/NBLb(0), . . . , BLb(m−1)/NBLb(m−1) in accordance with a column address signal that indicates a memory cell column including a memory cell to be accessed. The data I/O circuits 12 write data into a memory cell selected by the row decoder 3 and each of the column decoders 9 or read data from the selected memory cell.

The SRAM macro 10 includes a control circuit 11. The control circuit 11 controls the operations of the row decoder 3 and the data I/O circuits 12 provided with the column decoders 9.

The operations of the semiconductor memory 100 having the above configuration will be described. First, the following is an explanation of the operation in which a non-defective memory cell 4 is specified by an externally input row address signal and column address signal.

Upon receiving a row address signal, the row decoder 3 compares the address indicated by the row address signal with the address of a defective memory cell row including the defective memory cell 5, which is indicated by the redundancy repair signal from the row redundancy repair signal generator 1. The two addresses are not matched, so that the row decoder 3 selects a word line WL(j) for the non-defective memory cell 4. The memory cell 4 that corresponds to the word line WL(j) is connected electrically to a bit line pair BLa(i)/NBLa(i). The column decoder 9 selects the bit line pair BLa(i)/NBLa(i) for the memory cell 4 in accordance with an externally input column address signal. Therefore, the bit line pair BLa(i)/NBLa(i) is connected electrically to the memory cell 4 and the data I/O circuit 12.

For a writing operation, data is input externally to the data I/O circuit 12, transferred through the bit line pair BLa(i)/NBLa(i), and written into the memory cell 4. For a reading operation, the stored data is read from the memory cell 4, transferred through the bit line pair BLa(i)/NBLa(i), and output from the data I/O circuit 12.

Next, the following is an explanation of the operation in which the defective memory cell 5 is specified by an externally input row address signal and column address signal.

Upon receiving a row address signal specifying the defective memory cell 5, the row decoder 3 compares the address indicated by the row address signal with the address of a defective memory cell row including the defective memory cell 5, which is indicated by the redundancy repair signal from the row redundancy repair signal generator 1. The two addresses are matched, so that the row decoder 3 selects the word line WL(r) for the redundant memory cell 6 instead of the word line WL(j−1) for the defective memory cell 5. This functional replacement of the defective memory cell row (including the defective memory cell 5) by the redundant memory cell row 7 (including the redundant memory cell 6) can repair the defective memory cell 5.

In Embodiment 1, the row redundancy repair signal generator 1 is located opposite to the row decoder 3 with one memory cell array 2 sandwiched therebetween. This configuration can reduce an area loss caused by the location of the row redundancy repair signal generator 1.

Embodiment 2

Figure 2:
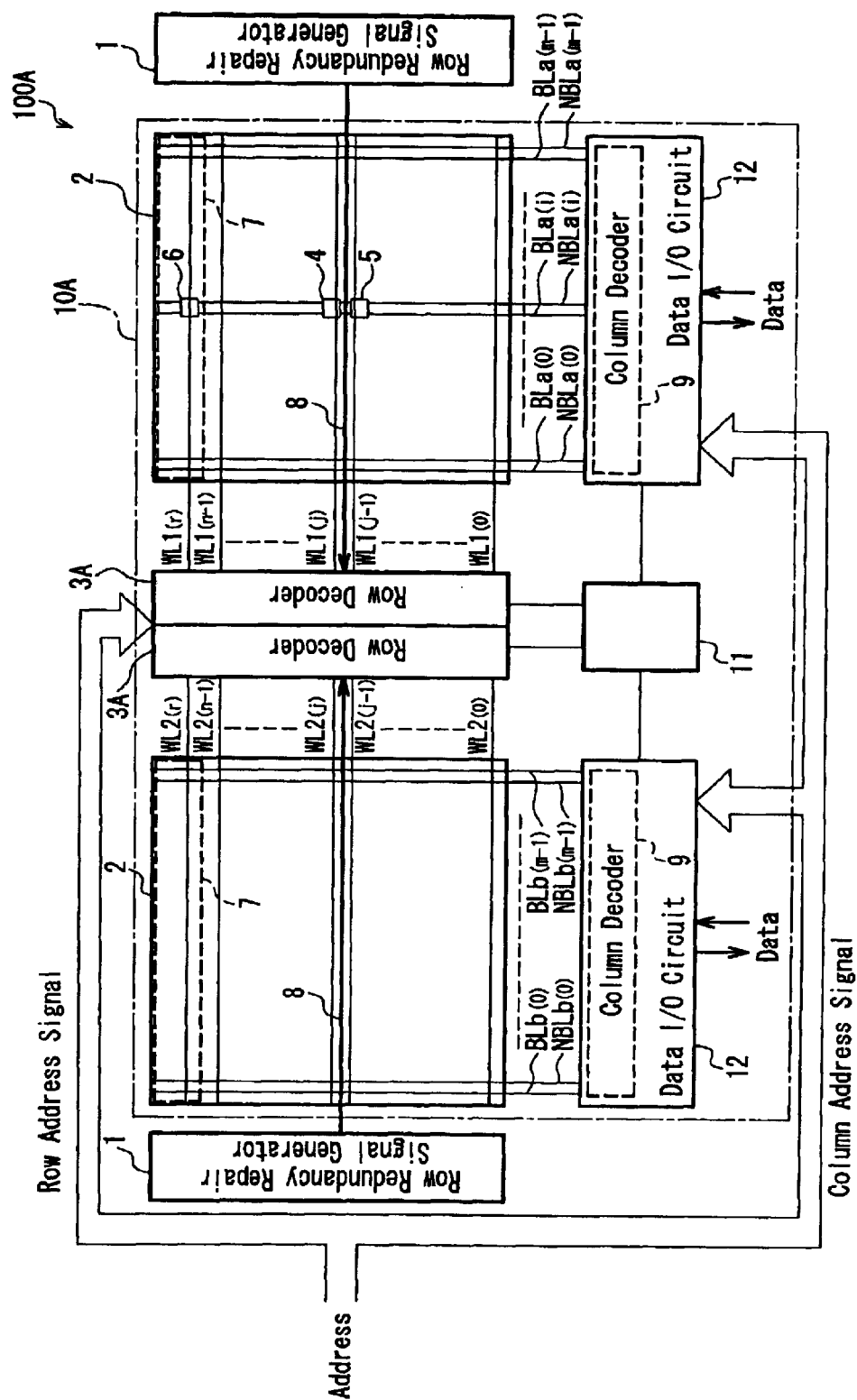
FIG. 2 is a block diagram showing the configuration of a semiconductor memory of Embodiment 2.

FIG. 2 is a block diagram showing the configuration of a semiconductor memory 100A of Embodiment 2. The identical elements to those of the semiconductor memory 100 in FIG. 1 are denoted by the same reference numerals, and a detailed description will not be repeated. The semiconductor memory 100A differs from the semiconductor memory 100 in that two row decoders 3A are used instead of the row decoder 3.

The semiconductor memory 100A is formed as a SRAM and provided with a SRAM macro 10A. The SRAM macro 10A includes two memory cell arrays 2 in the row direction. The memory cell arrays 2 are substantially rectangular in shape.

Each of the memory cell arrays 2 includes n (n is an integer not less than 2) memory cell rows, and each of the memory cell rows includes m (m is an integer not less than 2) memory cells 4 arranged in the row direction. Each of the memory cell arrays 2 also includes at least one redundant memory cell row 7 for repairing a defective memory cell row of the n memory cell rows that includes a defective memory cell 5, and the redundant memory cell row 7 includes m redundant memory cells 6 arranged in the row direction.

In the SRAM macro 10A, n word lines WL1(0), . . . , WL1(n−1) are arranged in the row direction for each of the n memory cell rows of one memory cell array 2 and extend across this memory cell array 2. Moreover, at least one word line WL1(r) (r is an integer not less than 1) is arranged in the row direction for each of the at least one redundant memory cell row 7 of one memory cell array 2 and extends across this memory cell array 2.

Two row decoders 3A are located between the memory cell arrays 2 with one row decoder 3A facing one memory cell array 2 and the other row decoder 3A facing the other memory cell array 2.

In the SRAM macro 10A, n word lines WL2(0), . . . , WL2(n−1) are arranged in the row direction for each of the n memory cell rows of the other memory cell array 2 and extend across this memory cell array 2. Moreover, at least one word line WL2(r) is arranged in the row direction for each of the at least one redundant memory cell row 7 of the other memory cell array 2 and extends across this memory cell array 2.

In one memory cell array 2, m complementary bit line pairs BLa(0)/NBLa(0), . . . , BLa(m−1)/NBLa(m−1) are arranged in the column direction for each of the m memory cell columns. In the other memory cell array 2, m complementary bit line pairs BLb(0)/NBLb(0), . . . , BLb(m−1)/ NBLb(m−1) are arranged in the column direction for each of the m memory cell columns.

The semiconductor memory 100A includes two row redundancy repair signal generators 1. One row redundancy repair signal generator 1 is located outside the SRAM macro 10A and opposite to the row decoder 3A with one memory cell array 2 sandwiched between the row decoder 3A and the row redundancy repair signal generator 1. The other row redundancy repair signal generator 1 is located outside the SRAM macro 10A and opposite to the row decoder 3A with the other memory cell array 2 sandwiched between the row decoder 3A and the row redundancy repair signal generator 1.

Each of the row redundancy repair signal generators 1 includes a plurality of fuses (not shown) that are disconnected selectively to store the address of the defective memory cell 5. According to the address stored in the fuses, the row redundancy repair signal generators 1 generate a redundancy repair signal that indicates the address of a defective memory cell row including the defective memory cell 5.

A redundancy repair signal line 8 for supplying the redundancy repair signal to one row decoder 3A is arranged between this row decoder 3A and the corresponding row redundancy repair signal generator 1 and extends across one memory cell array 2. The redundancy repair signal line 8 is located between adjacent word lines WL1(j) and WL1(j−1). The redundancy repair signal line 8 and a word line WL1(0) through WL1(n−1) are formed in the same wiring layer.

Similarly, a redundancy repair signal line 8 for supplying the redundancy repair signal to the other row decoder 3A is arranged between this row decoder 3A and the corresponding row redundancy repair signal generator 1 and extends across the other memory cell array 2. The redundancy repair signal line 8 is located between adjacent word lines WL2(j) and WL2(j−1). The redundancy repair signal line 8 and a word line WL2(0) through WL2(n−1) are formed in the same wiring layer.

The row decoders 3A receive a row address signal that indicates a memory cell row including a memory cell to be accessed and select word lines WL1(r) and WL2(r) in accordance with the redundancy repair signals generated by the row redundancy repair signal generators 1, respectively.

The SRAM macro 10A includes two data I/O circuits 12 that face the respective memory cell arrays 2. Each of the data I/O circuits 12 is provided with a column decoder 9. The column decoder 9 facing one memory cell array 2 selects any of the complementary bit line pairs BLa(0)/ NBLa(0), . . . , BLa(m−1)/NBLa(m−1) in accordance with a column address signal that indicates a memory cell column including a memory cell to be accessed. The column decoder 9 facing the other memory cell array 2 selects any of the complementary bit line pairs BLb(0)/NBLb(0), . . . , BLb (m−1)/NBLb(m−1) in accordance with a column address signal that indicates a memory cell column including a memory cell to be accessed. The data I/O circuits 12 write data into a memory cell selected by each of the row decoders 3A and the column decoders 9 or read data from the selected memory cell.

The SRAM macro 10A includes a control circuit 11. The control circuit 11 controls the operations of the row decoders 3A and the data I/O circuits 12 provided with the column decoders 9.

The operations of the semiconductor memory 100A having the above configuration will be described. First, the following is an explanation of the operation in which a non-defective memory cell 4 is specified by an externally input row address signal and column address signal.

Upon receiving a row address signal, each of the row decoders 3A compares the address indicated by the row address signal with the address of a defective memory cell row including the defective memory cell 5, which is indicated by the redundancy repair signal from the row redundancy repair signal generator 1. The two addresses are not matched, so that the row decoders 3A select word lines WL1(j) and WL2(j) for the non-defective memory cells 4, respectively. The memory cell 4 that corresponds to the word line WL1(j) is connected electrically to a bit line pair BLa(i)/NBLa(i), while the memory cell 4 that corresponds to the word line WL2(j) is connected electrically to a bit line pair BLb(i)/NBLb(i). The column decoder 9 provided in the data I/O circuit 12 that faces one memory cell array 2 selects the bit line pair BLa(i)/NBLa(i) for the memory cell 4 in accordance with an externally input column address signal. Therefore, the bit line pair BLa(i)/NBLa(i) is connected electrically to the memory cell 4 and the data I/O circuit 12.

For a writing operation, data is input externally to the data I/O circuit 12, transferred through the bit line pair BLa(i)/NBLa(i), and written into the memory cell 4. For a reading operation, the stored data is read from the memory cell 4, transferred through the bit line pair BLa(i)/NBLa(i), and output from the data I/O circuit 12.

Next, the following is an explanation of the operation in which the defective memory cell 5 included in one of the memory cell arrays 2 is specified by an externally input row address signal and column address signal.

Upon receiving a row address signal specifying the defective memory cell 5, the row decoder 3A that faces the memory cell array 2 including the defective memory cell 5 compares the address indicated by the row address signal with the address of a defective memory cell row including the defective memory cell 5, which is indicated by the redundancy repair signal from the row redundancy repair signal generator 1. The two addresses are matched, so that the row decoder 3A selects the word line WL1(r) for the redundant memory cell 6 instead of the word line WL1(j−1) for the defective memory cell 5. This functional replacement of the defective memory cell row (including the defective memory cell 5) by the redundant memory cell row 7 (including the redundant memory cell 6) can repair the defective memory cell 5.

In Embodiment 2, one row redundancy repair signal generator 1 is located opposite to the row decoder 3A with one memory cell array 2 sandwiched therebetween, and the other row redundancy repair signal generator 1 is located opposite to the row decoder 3A with the other memory cell array 2 sandwiched therebetween. This configuration can reduce an area loss caused by the location of each of the row redundancy repair signal generators 1.

Moreover, the memory cell arrays 2 are in one-to-one correspondence with the row decoders 3A, and thus the word lines extending across each of the memory cell arrays 2 can be selected independently. Therefore, the length of a word line that is driven by each of the row decoders 3A is half the length of a word line that is driven by the row decoder 3 in Embodiment 1. This makes it possible to reduce power consumption of the row decoders.

Embodiment 3

Figure 3:
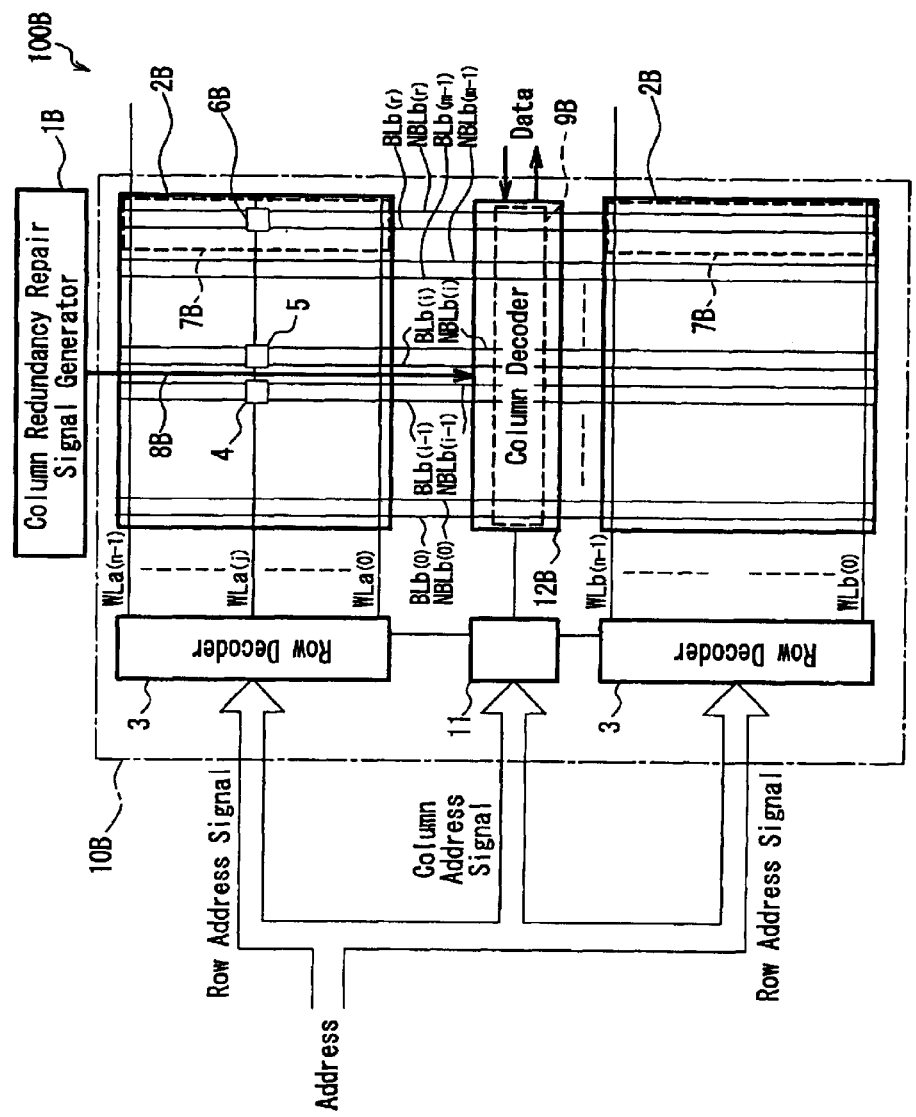
FIG. 3 is a block diagram showing the configuration of a semiconductor memory of Embodiment 3.

FIG. 3 is a block diagram showing the configuration of a semiconductor memory 100B of Embodiment 3. The identical elements to those of the semiconductor memory 100 in FIG. 1 are denoted by the same reference numerals, and a detailed description will not be repeated.

The semiconductor memory 100B is formed as a SRAM and provided with a SRAM macro 10B. The SRAM macro 10B includes two memory cell arrays 2B in the column direction. The memory cell arrays 2B are substantially rectangular in shape.

Each of the memory cell arrays 2B include m (m is an integer not less than 2) memory cell columns, and each of the memory cell columns includes n (n is an integer not less than 2) memory cells 4 arranged in the column direction. Each of the memory cell arrays 2B also includes at least one redundant memory cell column 7B for repairing a defective memory cell column of the m memory cell columns that includes a defective memory cell 5, and the redundant memory cell column 7B includes n redundant memory cells 6B arranged in the column direction.

In the SRAM macro 10B, n word lines WLa(0), . . . , WLa(n−1) are arranged in the row direction for each of the n memory cell rows of one memory cell array 2B and extend across this memory cell array 2B. Moreover, n word lines WLb(0), . . . , WLb(n−1) are arranged in the row direction for each of the n memory cell rows of the other memory cell array 2B and extend across this memory cell array 2B.

A data I/O circuit 12B is located between the memory cell arrays 2B with one side facing one memory cell array 2B and the other side facing the other memory cell array 2B. The data I/O circuit 12B is provided with a column decoder 9B. The SRAM of Embodiment 3 is adapted to include many large-capacity memory cells particularly in the column direction. Therefore, the operating speed is decreased due to a wiring load of longer complementary bit line pairs. To suppress such a decrease in operating speed, the memory cell array region is divided into upper and lower memory cell arrays by the data I/O circuit 12B, so that the wiring load can be reduced.

In the SRAM macro 10B, m complementary bit line pairs BLb(0)/NBLb(0), . . . , BLb(m−1)/NBLb(m−1) are arranged in the column direction for each of the m memory cell columns of the memory cell arrays 2B and extend across one memory cell array 2B, the column decoder 9B, and the other memory cell array 2B.

The semiconductor memory 100B includes a column redundancy repair signal generator 1B. The column redundancy repair signal generator 1B is located outside the SRAM macro 10B and opposite to the column decoder 9B with one memory cell array 2B sandwiched between the column decoder 9B and the column redundancy repair signal generator 1B. The column redundancy repair signal generator 1B includes a plurality of fuses (not shown) that are disconnected selectively to store the address of the defective memory cell 5. According to the address stored in the fuses, the column redundancy repair signal generator 1B generates a redundancy repair signal that indicates the address of a defective memory cell column including the defective memory cell 5.

A redundancy repair signal line 8B for supplying the redundancy repair signal to the column decoder 9B is arranged between the column decoder 9B and the column redundancy repair signal generator 1B and extends across one memory cell array 2B. The redundancy repair signal line 8B is located between adjacent complementary bit line pairs BLb(i−1)/NBLb(i−1) and BLb(i)/NBLb(i). The redundancy repair signal line 8B and a complementary bit line pair BLb(0)/NBLb(0) through BLb(m−1)/NBLb(m−1) are formed in the same wiring layer.

Each of row decoders 3 receives a row address signal that indicates a memory cell row including a memory cell to be accessed and selects any of the word lines in accordance with the row address signal. The column decoder 9B selects any of the complementary bit line pairs BLb(0)/NBLb(0), . . . , BLb(m−1)/NBLb(m−1) in accordance with a column address signal that indicates a memory cell column including a memory cell to be accessed.

The data I/O circuit 12B writes data into a memory cell selected by each of the row decoders 3 and the column decoder 9B or read data from the selected memory cell.

The SRAM macro 10B includes a control circuit 11. The control circuit 11 controls the operations of the row decoders 3 and the data I/O circuit 12B provided with the column decoder 9B.

The operations of the semiconductor memory 100B having the above configuration will be described. First, the following is an explanation of the operation in which a non-defective memory cell 4 is specified by an externally input row address signal and column address signal.

Upon receiving a row address signal, each of the row decoders 3 selects a word line in accordance with the address indicated by the row address signal. The memory cell 4 that corresponds to the selected word line is connected electrically to a bit line pair BLb(i−1)/NBLb(i−1).

The column decoder 9B compares the address indicated by an externally input column address signal with the address of a defective memory cell column including the defective memory cell 5, which is indicated by the redundancy repair signal from the column redundancy repair signal generator 1B. The two addresses are not matched, so that the column decoder 9B selects the bit line pair BLb(i−1)/NBLb(i−1) for the non-defective memory cell 4. Therefore, the bit line pair BLb(i−1)/NBLb(i−1) is connected electrically to the memory cell 4 and the data I/O circuit 12B.

For a writing operation, data is input externally to the data I/O circuit 12B, transferred through the bit line pair BLb(i−1)/NBLb(i−1), and written into the memory cell 4. For a reading operation, the stored data is read from the memory cell 4, transferred through the bit line pair BLb(i−1)/NBLb(i−1), and output from the data I/O circuit 12B.

Next, the following is an explanation of the operation in which the defective memory cell 5 is specified by an externally input row address signal and column address signal.

Upon receiving a column address signal specifying the defective memory cell 5, the column decoder 9B compares the address indicated by the column address signal with the address of a defective memory cell column including the defective memory cell 5, which is indicated by redundancy repair signal from the column redundancy repair signal generator 1B. The two addresses are matched, so that the column decoder 9B selects the bit line pair BLb(r)/NBLb(r) for the redundant memory cell 6B instead of the bit line pair BLb(i)/NBLb(i) for the defective memory cell 5. This functional replacement of the defective memory cell column (including the defective memory cell 5) by the redundant memory cell column 7B (including the redundant memory cell 6B) can repair the defective memory cell 5.

In Embodiment 3, the column redundancy repair signal generator 1B is located opposite to the column decoder 9B with one memory cell array 2B sandwiched therebetween. This configuration can reduce an area loss caused by the location of the column redundancy repair signal generator 1B.

Embodiment 4

Figure 4:
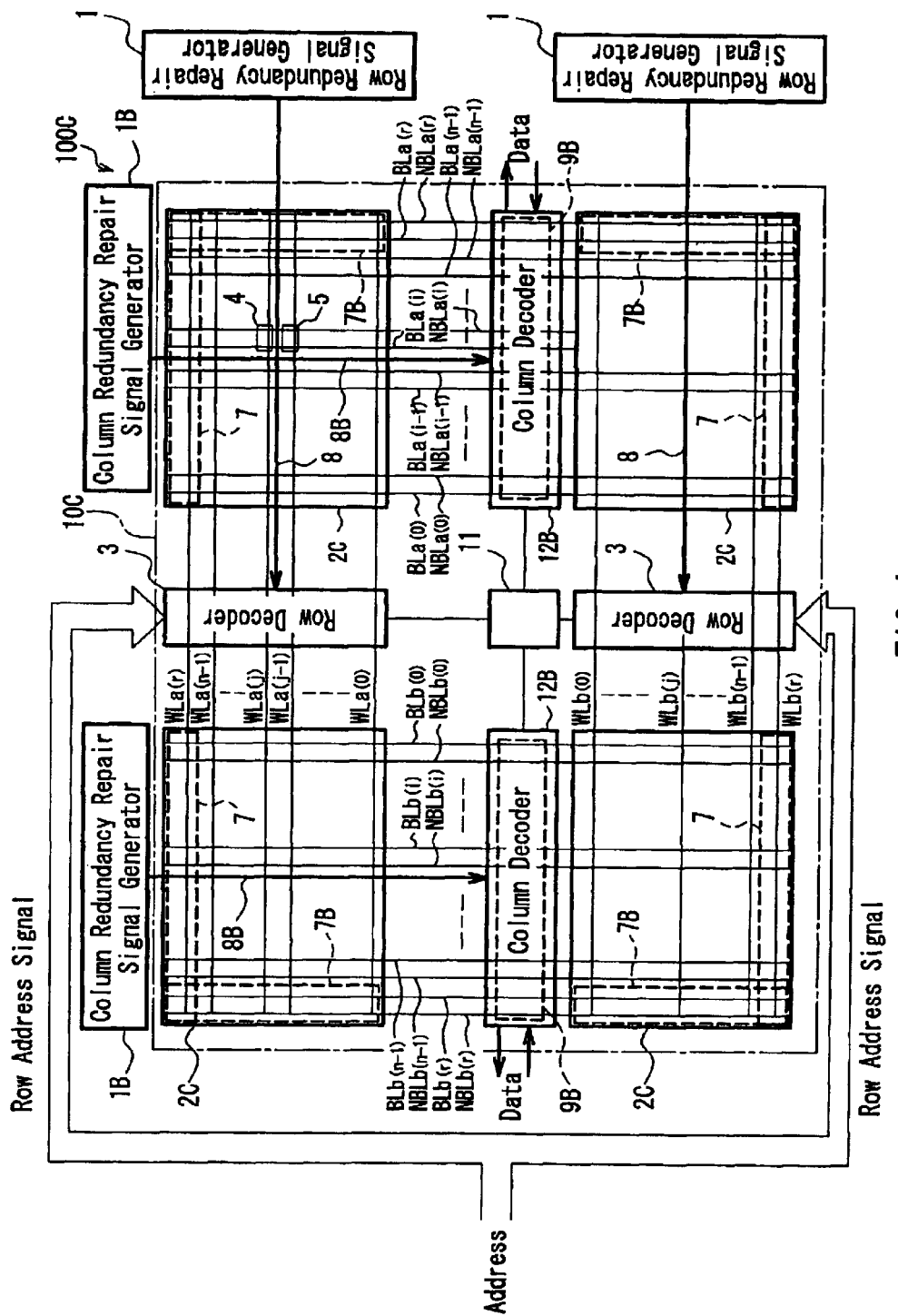
FIG. 4 is a block diagram showing the configuration of a semiconductor memory of Embodiment 4.

FIG. 4 is a block diagram showing the configuration of a semiconductor memory 100C of Embodiment 4. The identical elements to those of the semiconductor memories 100, 100B in FIGS. 1 and 3 are denoted by the same reference numerals, and a detailed description will not be repeated.

The semiconductor memory 100C is formed as a SRAM and provided with a SRAM macro 10C. The SRAM macro 10C includes four memory cell arrays 2C in the form of a matrix having 2 rows and 2 columns. The memory cell arrays 2C are substantially rectangular in shape.

Each of the memory cell arrays 2C includes n (n is an integer not less than 2) memory cell rows, and each of the memory cell rows includes n memory cells 4 arranged in the row direction. Each of the memory cell arrays 2C also includes at least one redundant memory cell row 7 for repairing a defective memory cell row of the n memory cell rows that includes a defective memory cell 5, and the redundant memory cell row 7 includes n redundant memory cells arranged in the row direction. Moreover, each of the memory cell arrays 2C includes at least one redundant memory cell column 7B for repairing a defective memory cell column of the n memory cell columns that includes the defective memory cell 5, and the redundant memory cell column 7B includes at least n redundant memory cells arranged in the column direction.

In FIG. 4, a row decoder 3 is located between the upper right and the upper left memory cell array 2C with one side facing the upper right memory cell array 2C and the other side facing the upper left memory cell array 2C. Similarly, another row decoder 3 is located between the lower right and the lower left memory cell array 2C with one side facing the lower right memory cell array 2C and the other side facing the lower left memory cell array 2C.

In the SRAM macro 10C, n word lines WLa(0), . . . , WLa(n−1) are arranged in the row direction for each of the n memory cell rows of the upper right and the upper left memory cell array 2C and extend across the upper right memory cell array 2C, the row decoder 3, and the upper left memory cell array 2C. Moreover, at least one word line WLa(r) (r is an integer not less than 1) is arranged in the row direction for each of the at least one redundant memory cell row 7 of the upper right and the upper left memory cell array 2C and extends across the upper right memory cell array 2C, the row decoder 3, and the upper left memory cell array 2C.

In the SRAM macro 10C, n word lines WLb(0), . . . , WLb(n−1) are arranged in the row direction for each of the n memory cell rows of the lower right and the lower left memory cell array 2C and extend across the lower right memory cell array 2C, the row decoder 3, and the lower left memory cell array 2C. Moreover, at least one word line WLb(r) (r is an integer not less than 1) is arranged in the row direction for each of the at least one redundant memory cell row 7 of the lower right and the lower left memory cell array 2C and extends across the lower right memory cell array 2C, the row decoder 3, and the lower left memory cell array 2C.

In the SRAM macro 10C, n complementary bit line pairs BLa(0)/NBLa(0), . . . , BLa(n−1)/NBLa(n−1) are arranged in the column direction for each of the n memory cell columns of the upper right and the lower right memory cell array 2C and extend across the upper right memory cell array 2C, a column decoder 9B, and the lower right memory cell array 2C. Moreover, n complementary bit line pairs BLb(0)/NBLb(0), . . . , BLb(n−1)/NBLb(n−1) are arranged in the column direction for each of the n memory cell columns of the upper left and the lower left memory cell array 2C and extend across the upper left memory cell array 2C, a column decoder 9B, and the lower left memory cell array 2C.

The semiconductor memory 100C includes two row redundancy repair signal generators 1. One row redundancy repair signal generator 1 is located outside the SRAM macro 10C and opposite to the upper row decoder 3 with the upper right memory cell array 2C sandwiched between the upper row decoder 3 and the row redundancy repair signal generator 1. The other row redundancy repair signal generator 1 is located outside the SRAM macro 10C and opposite to the lower row decoder 3 with the lower right memory cell array 2C sandwiched between the lower row decoder 3 and the row redundancy repair signal generator 1. Each of the row redundancy repair signal generators 1 includes a plurality of fuses (not shown) that are disconnected selectively to store the address of the defective memory cell 5. According to the address stored in the fuses, the row redundancy repair signal generators 1 generate a redundancy repair signal that indicates the address of a defective memory cell row including the defective memory cell 5.

Two redundancy repair signal lines for supplying the redundancy repair signal to each of the row decoders 3 are arranged between the row decoders 3 and the row redundancy repair signal generators 1 and extend across the upper right and the lower right memory cell array 2C, respectively. The upper redundancy repair signal line 8 is located between adjacent word lines WLa(j) and WLa(j−1). The upper redundancy repair signal line 8 and a word line WLa(0) through WLa(n−1) are formed in the same wiring layer. The lower redundancy repair signal line 8 is located between adjacent word lines WLb(j) and WLb(j−1). The lower redundancy repair signal line 8 and a word line WLb(0) through WLb(n−1) are formed in the same wiring layer.

The semiconductor memory 100C includes two column redundancy repair signal generators 1B. One column redundancy repair signal generator 1B is located outside the SRAM macro 10C and opposite to the right column decoder 9B with the upper right memory cell array 2C sandwiched between the right column decoder 9B and the column redundancy repair signal generator 1B. The other column redundancy repair signal generator 1B is located outside the SRAM macro 10C and opposite to the left column decoder 9B with the upper left memory cell array 2C sandwiched between the left column decoder 9B and the column redundancy repair signal generator 1B.

Each of the column redundancy repair signal generators 1B includes a plurality of fuses (not shown) that are disconnected selectively to store the address of the defective memory cell 5. According to the address stored in the fuses, the column redundancy repair signal generators 1B generate a redundancy repair signal that indicates the address of a defective memory cell column including the defective memory cell 5.

Two redundancy repair signal lines 8B for supplying the redundancy repair signal to each of the column decoders 9B are arranged between the column decoders 9B and the column redundancy repair signal generators 1B and extend across the upper right and the upper left memory cell array 2C, respectively. The right redundancy repair signal line 8B is located between adjacent complementary bit line pairs BLa(i−1)/NBLa(i−1) and BLa(i)/NBLa(i). The right redundancy repair signal line 8B and a complementary bit line pair BLa(0)/NBLa(0) through BLa(n−1)/NBLa(n−1) are formed in the same wiring layer. The left redundancy repair signal line 8B is located between adjacent complementary bit line pairs BLb(i−1)/NBLb(i−1) and BLb(i)/NBLb(i). The left redundancy repair signal line 8B and a complementary bit line pair BLb(0)/NBLb(0) through BLb(n−1)/NBLb(n−1) are formed in the same wiring layer.

The upper row decoder 3 receives a row address signal that indicates a memory cell row including a memory cell to be accessed and selects a word line WLa(r) in accordance with the redundancy repair signal generated by the corresponding row redundancy repair signal generator 1. The lower row decoder 3 receives a row address signal that indicates a memory cell row including a memory cell to be accessed and selects a word line WLb(r) in accordance with the redundancy repair signal generated by the corresponding row redundancy repair signal generator 1. The right column decoder 9B receives a column address signal that indicates a memory cell column including a memory cell to be accessed and selects a complementary bit line pair BLa(r)/NBLa(r), which extends along the redundant memory cell column 7B, in accordance with the redundancy repair signal generated by the corresponding column redundancy repair signal generator 1B. The left column decoder 9B receives a column address signal that indicates a memory cell column including a memory cell to be accessed and selects a complementary bit line pair BLb(r)/NBLb(r), which extends along the redundant memory cell column 7B, in accordance with the redundancy repair signal generated by the corresponding column redundancy repair signal generator 1B.

The SRAM macro 10C includes a control circuit 11. The control circuit 11 controls the operations of the row decoders 3 and the data I/O circuits 12B provided with the column decoders 9B.

The SRAM of Embodiment 4 is adapted to include large-capacity memory cells. Therefore, the operating speed is decreased due to wiring loads of longer word lines and bit lines. To suppress such a decrease in operating speed, the memory cell array region is divided into right and left memory cell arrays by each of the upper and lower row decoders 3, so that the wiring load of the word lines can be reduced. Moreover, the memory cell array region is divided into upper and lower memory cell arrays by each of the right and left data I/O circuits 12B, so that the wiring load of the bit lines can be reduced.

The semiconductor memory 100C of Embodiment 4 has the redundancy repair function in both row and column directions. Therefore, when the redundant memory cell row is found defective and cannot be used instead of the externally selected memory cell row including a defective memory cell, the memory cell column including the defective memory cell can be replaced by the redundant memory cell column, making it possible to repair the defective memory cell. This redundancy repair function in row and column directions can achieve the redundancy repair with higher flexibility.

In Embodiment 4, the upper row redundancy repair signal generator 1 is located opposite to the upper row decoder 3 with the upper right memory cell array 2C sandwiched therebetween. The lower row redundancy repair signal generator 1 is located opposite to the lower row decoder 3 with the lower right memory cell array 2C sandwiched therebetween. The right column redundancy repair signal generator 1B is located opposite to the right column decoder 9B with the upper right memory cell array 2C sandwiched therebetween. The left column redundancy repair signal generator 1B is located opposite to the left column decoder 9B with the upper left memory cell array 2C sandwiched therebetween. This configuration can reduce an area loss caused by the location of each of the redundancy repair signal generators.

Embodiment 5

Figure 5:
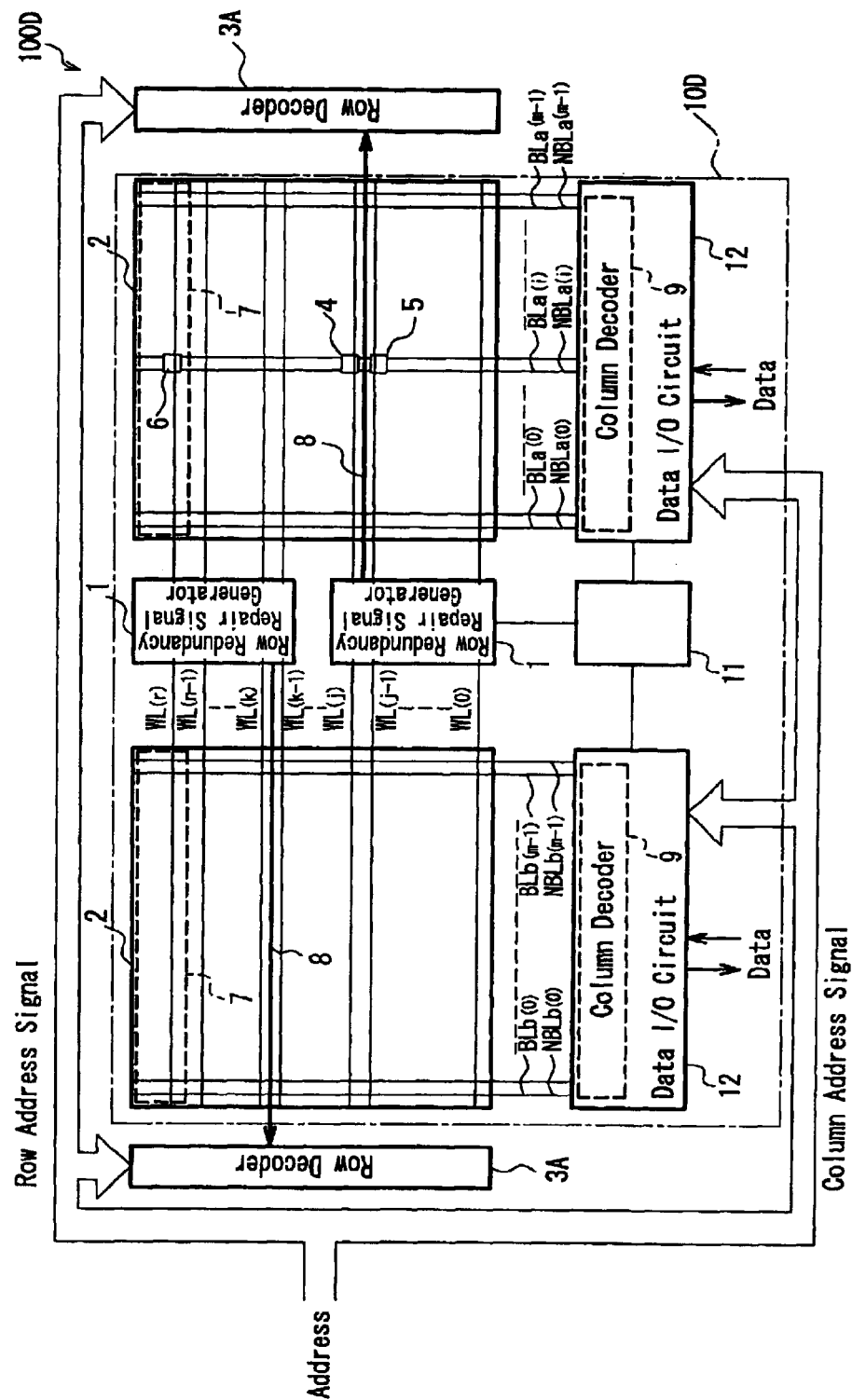
FIG. 5 is a block diagram showing the configuration of a semiconductor memory of Embodiment 5.

FIG. 5 is a block diagram showing the configuration of a semiconductor memory 100D of Embodiment 5. The identical elements to those of the semiconductor memory 100A in FIG. 2 are denoted by the same reference numerals, and a detailed description will not be repeated.

The semiconductor memory 100D is formed as a SRAM and provided with a SRAM macro 10D. The SRAM macro 10D includes two memory cell arrays 2 in the row direction. The memory cell arrays 2 are substantially rectangular in shape.

Each of the memory cell arrays 2 include n (n is an integer not less than 2) memory cell rows, and each of the memory cell rows includes m (m is an integer not less than 2) memory cells 4 arranged in the row direction. Each of the memory cell arrays 2 also includes at least one redundant memory cell row 7 for repairing a defective memory cell row of the n memory cell rows that includes a defective memory cell 5, and the redundant memory cell row 7 includes m redundant memory cells 6 arranged in the row direction.

Two row redundancy repair signal generators 1 are located between the memory cell arrays 2 and arranged side by side in the column direction. Each of the row redundancy repair signal generators 1 generates a redundancy repair signal that indicates the address of a defective memory cell row including the defective memory cell 5 of the corresponding memory cell array 2.

In the SRAM macro 10D, n word lines WL(0), ..., WL(n−1) are arranged in the row direction for each of the n memory cell rows of the memory cell arrays 2 and extend across one memory cell array 2, either of the row redundancy repair signal generators 1, and the other memory cell array 2. Moreover, at least one word line WL(r) (r is an integer not less than 1) is arranged in the row direction for each of the at least one redundant memory cell row 7 of the memory cell arrays 2 and extends across one memory cell array 2, one row redundancy repair signal generator 1, and the other memory cell array 2.

In one memory cell array 2, m complementary bit line pairs BLa(0)/NBLa(0), ..., BLa(m−1)/NBLa(m−1) are arranged in the column direction for each of the m memory cell columns. In the other memory cell array 2, m complementary bit line pairs BLb(0)/NBLb(0), ..., BLb(m−1)/NBLb(m−1) are arranged in the column direction for each of the m memory cell columns.

The semiconductor memory 100D includes two row decoders 3A. One row decoder 3A is located outside the SRAM macro 10D and opposite to the row redundancy repair signal generators 1 with one memory cell array 2 sandwiched between the row decoder 3A and the row redundancy repair signal generators 1. The other row decoder 3A is located outside the SRAM macro 10D and opposite to the row redundancy repair signal generators 1 with the other memory cell array 2 sandwiched between the row decoder 3A and the row redundancy repair signal generators 1.

A redundancy repair signal line 8 for supplying the redundancy repair signal to one row decoder 3A is arranged between this row decoder 3A and the corresponding row redundancy repair signal generator 1 and extends across one memory cell array 2. The redundancy repair signal line 8 is located between adjacent word lines WL(j) and WL(j−1). The redundancy repair signal line 8 and a word line WL(0) through WL(n−1) are formed in the same wiring layer.

Similarly, a redundancy repair signal line 8 for supplying the redundancy repair signal to the other row decoder 3A is arranged between this row decoder 3A and the corresponding row redundancy repair signal generator 1 and extends across the other memory cell array 2. The redundancy repair signal line 8 is located between adjacent word lines WL(k) and WL(k−1). The redundancy repair signal line 8 and a word line WL(0) through WL(n−1) are formed in the same wiring layer.

Each of the row decoders 3A receives a row address signal that indicates a memory cell row including a memory cell to be accessed and selects a word line WL(r) in accordance with the redundancy repair signal generated by the corresponding row redundancy repair signal generators 1.

The SRAM macro 10D includes two data I/O circuits 12 that face the respective memory cell arrays 2. Each of the data I/O circuits 12 is provided with a column decoder 9. The column decoder 9 facing one memory cell array 2 selects any of the complementary bit line pairs BLa(0)/NBLa(0), ..., BLa(m−1)/NBLa(m−1) in accordance with a column address signal that indicates a memory cell column including a memory cell to be accessed. The column decoder 9 facing the other memory cell array 2 selects any of the complementary bit line pairs BLb(0)/NBLb(0), ..., BLb(m−1)/NBLb(m−1) in accordance with a column address signal that indicates a memory cell column including a memory cell to be accessed. The data I/O circuits 12 write data into a memory cell selected by each of the row decoders 3A and the column decoders 9 or read data from the selected memory cell.

The SRAM macro 10D includes a control circuit 11. The control circuit 11 controls the operations of the row decoders 3A and the data I/O circuits 12 provided with the column decoders 9.

In Embodiment 5, each of the redundancy repair signal lines 8 extends across the memory cell arrays 2, so that two row redundancy repair signal generators 1 can be located in the same region between the memory cell arrays 2. This configuration is more advantageous in reducing an area loss than the configurations of Embodiments 1 and 2, where the row redundancy repair signal generator is located outside the SRAM macro.

Embodiment 6

Figure 6:
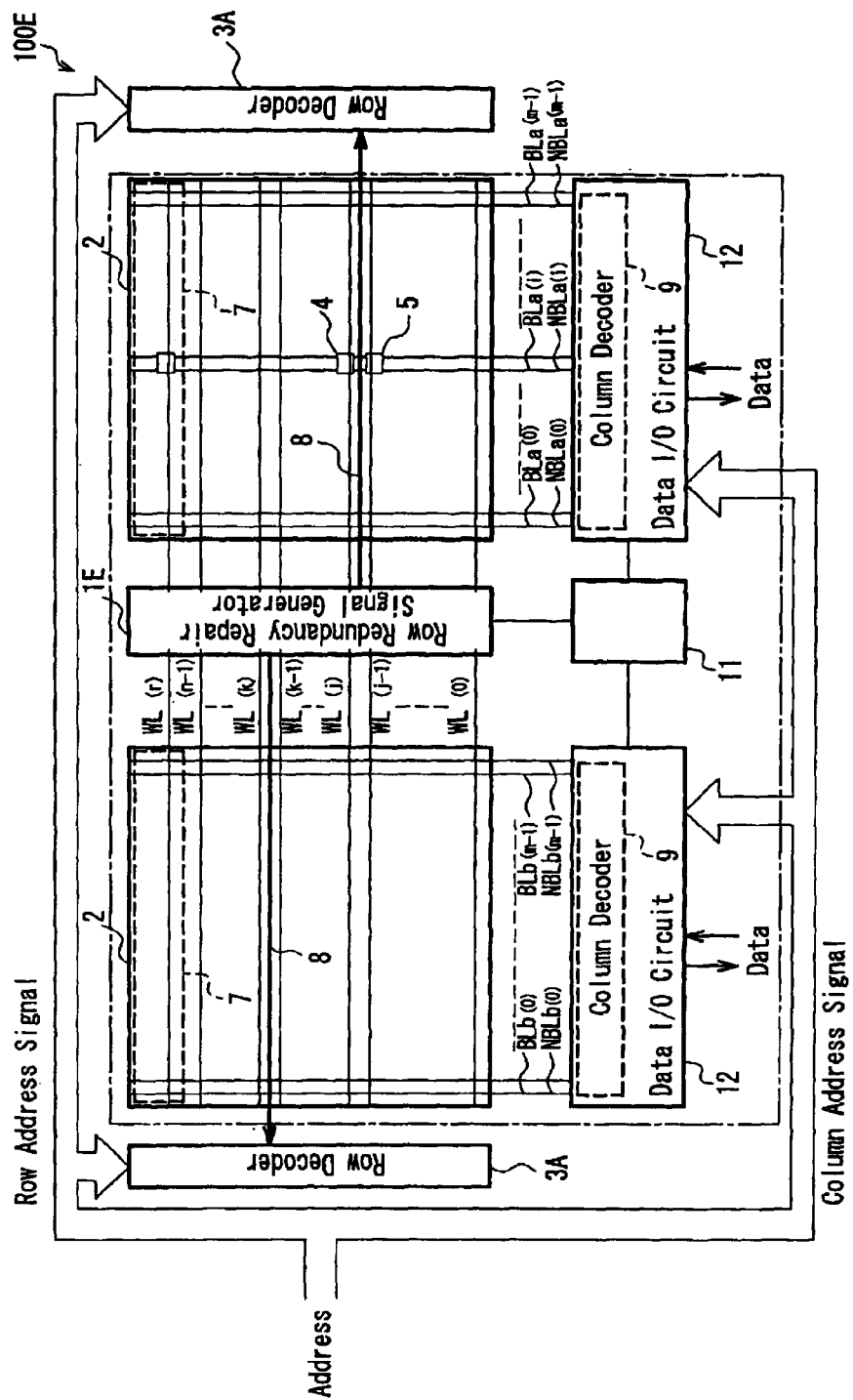
FIG. 6 is a block diagram showing the configuration of a semiconductor memory of Embodiment 6.

FIG. 6 is a block diagram showing the configuration of a semiconductor memory 100E of Embodiment 6. The identical elements to those of the semiconductor memory 100D in FIG. 5 are denoted by the same reference numerals, and a detailed description will not be repeated. The semiconductor memory 100E differs from the semiconductor memory 100D in that a row redundancy repair signal generator 1E is used instead of the two row redundancy repair signal generators 1.

Figure 7:
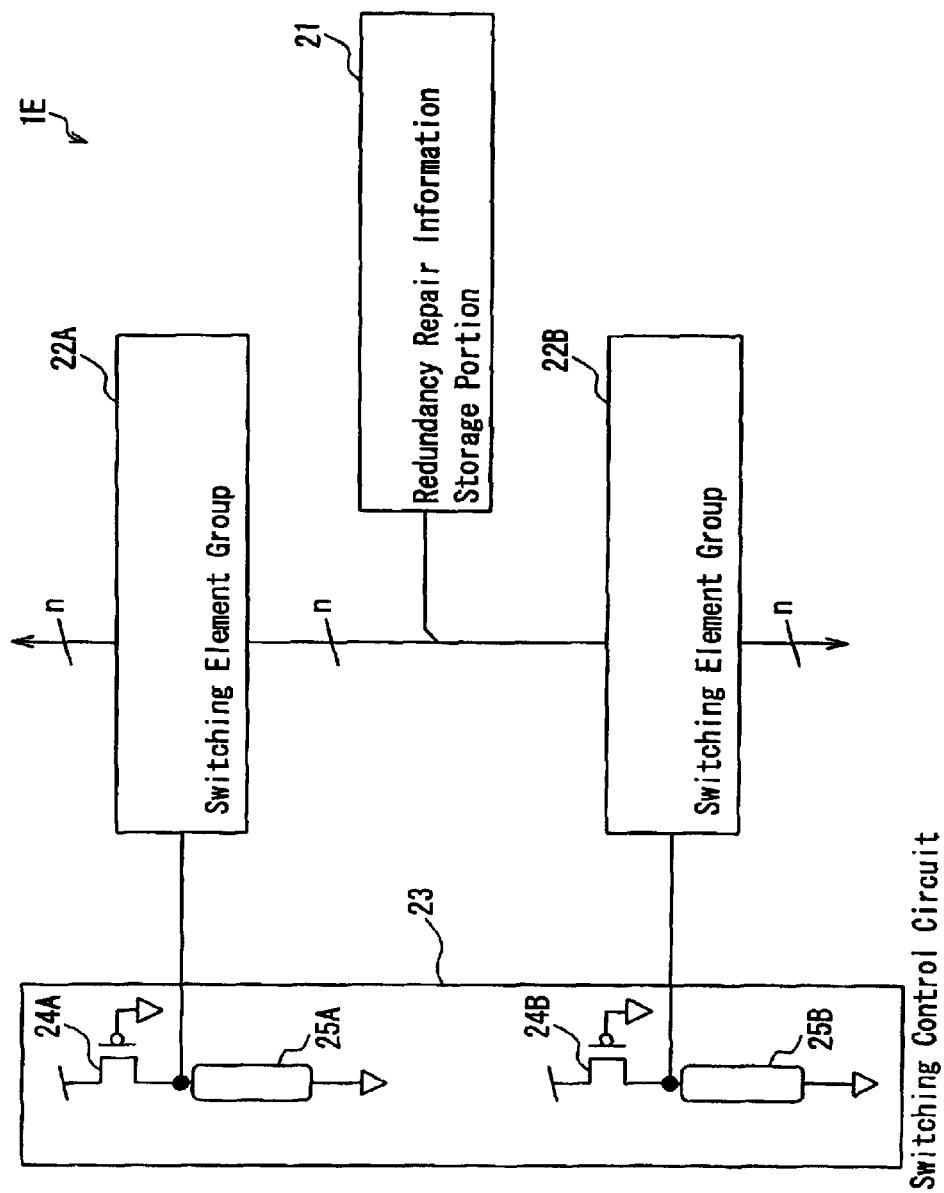
FIG. 7 is a block diagram showing the configuration of a row redundancy repair signal generator in the semiconductor memory of Embodiment 6.
Figure 8:
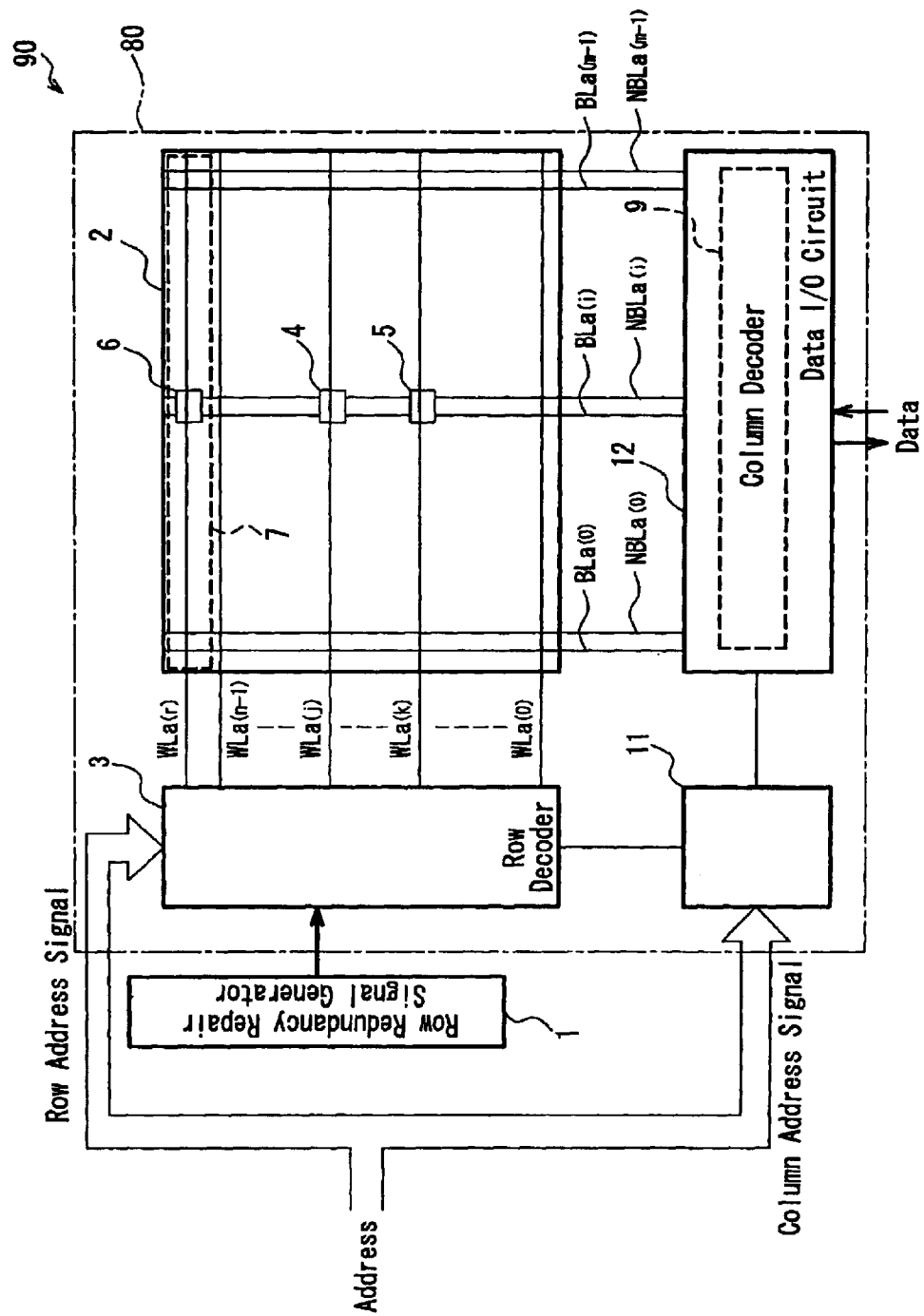
FIG. 8 is a block diagram showing the configuration of a conventional semiconductor memory.
Figure 9:
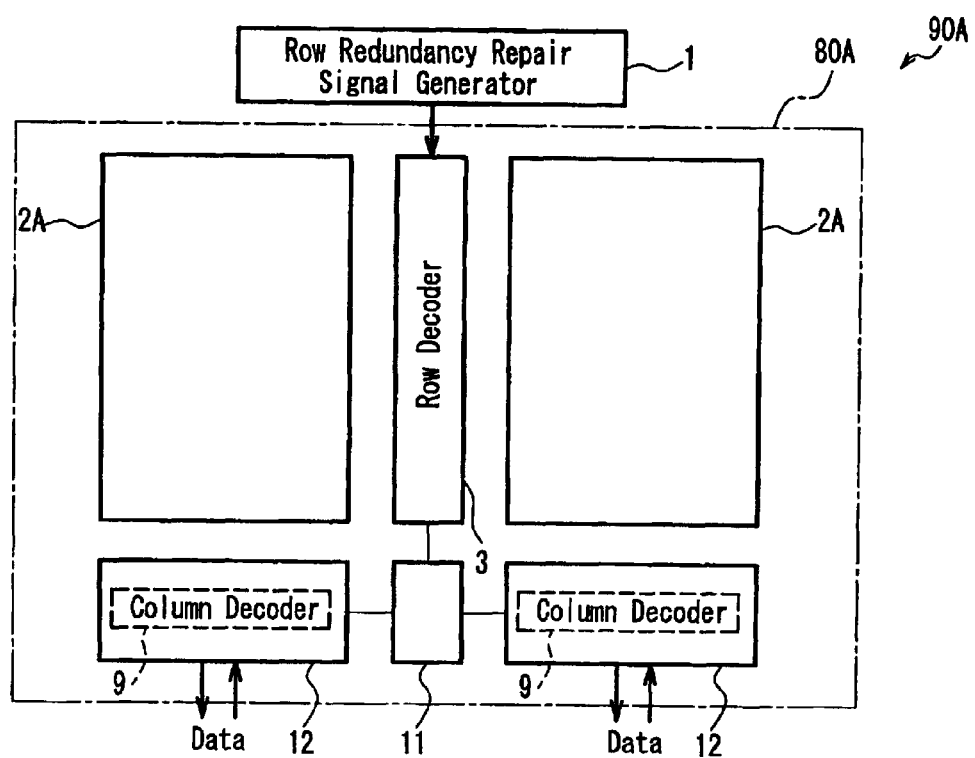
FIG. 9 is a block diagram showing the configuration of another conventional semiconductor memory.

FIG. 7 is a block diagram showing the configuration of the row redundancy repair signal generator 1E. The row redundancy repair signal generator 1E includes a redundancy repair information storage portion 21 that stores the information of first redundancy repair signals and the information of second redundancy repair signals. The first redundancy repair signals indicate the address of a defective memory cell row of one memory cell array 2. The second redundancy repair signals indicate the address of a defective memory cell row of the other memory cell array 2.

The row redundancy repair signal generator 1E includes two groups of switching elements 22A, 22B. The groups of switching elements 22A, 22B, each of which includes n switches, supply the first and second redundancy repair signals to right and left row decoders 3A, respectively.

The row redundancy repair signal generator 1E includes a switching control circuit 23. The switching control circuit 23 includes a P-channel MOS transistor 24A and a fuse 25A for controlling the group of switching elements 22A, and a P-channel MOS transistor 24B and a fuse 25B for controlling the group of switching elements 22B. The P-channel MOS transistors 24A, 24B have a gate terminal at a fixed source potential and exhibit high on-resistance.

In the semiconductor memory 100E, the switching control circuit 23 outputs a switching control signal to the group of switching elements 22A depending on whether the fuse 25A is disconnected, and another switching control signal to the group of switching elements 22B depending on whether the fuse 25B is disconnected.

Specifically, when the fuses 25A, 25B are not disconnected, the P-channel MOS transistors 24A, 24B have high on-resistance. Therefore, a ground potential is output via the fuses 25A, 25B as the switching control signal. When the fuses 25A, 25B are disconnected, a source potential is output via the P-channel MOS transistors 24A, 24B as the switching control signal. In other words, the switching control signal can be either a fixed potential signal of source potential or ground potential by disconnecting the fuse 25A or 25B. This allows one of the groups of switching elements 22A, 22B to be turned on. Thus, a redundancy repair signal (redundancy repair information) stored in the redundancy repair information storage portion 21 is output via the group of switching elements in the on state, thereby selecting a memory cell array to be repaired.

A N-bit redundancy repair signal stored in the redundancy repair information storage portion 21 is output via the groups of switching elements 22A, 22B to the respective memory cell arrays 2.

The writing and reading operations of SRAM in Embodiment 6 are the same as those in Embodiments 1 to 5, and the description will not be repeated.

In Embodiment 6, a redundancy repair signal line 8 is arranged on each of the memory cell arrays 2, so that the row redundancy repair signal generator 1E, which is common to both memory cell arrays 2, can be located between the memory cell arrays 2. Like Embodiment 5, this configuration is more advantageous in reducing an area loss than the configurations of Embodiments 1 and 2, where the row redundancy repair signal generator is located outside the SRAM macro. Moreover, the fuses for storing redundancy repair information also can be shared, thus providing further merit in reducing an area loss.

The use of the groups of switching elements 22A, 22B in the row redundancy repair signal generator 1E enables a redundancy repair operation even when the number of memory cell rows to be replaced in one memory cell array differs from that in the other memory cell array. Therefore, the redundancy repair function with higher flexibility can be achieved.

Like Embodiments 1 to 5, each of the redundancy repair signal lines 8 is located between adjacent word lines in the corresponding memory cell array 2. The redundancy repair signal lines 8 and the word lines are parallel to one another and formed in the same wiring layer. This configuration can provide the shielding effect of adjacent word lines.

As an example of the application of Embodiment 6, the row redundancy repair signal generator 1E may be located between the row decoders 3A, and the memory cell arrays 2 may be located opposite to the row redundancy repair signal generator 1E with the row decoders 3A sandwiched between the row redundancy repair signal generator 1E and the respective memory cell arrays 2. This configuration allows the fuses for storing redundancy repair information to be shared, thus achieving the same effect as described above.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor memory comprising:

a memory cell array including a plurality of memory cell rows and at least one redundant memory cell row for repairing a defective memory cell row of the memory cell rows that includes a defective memory cell, each of the memory cell rows comprising a plurality of memory cells arranged in a row direction, and the at least one redundant memory cell row comprising a plurality of redundant memory cells arranged in the row direction;

a redundancy repair signal generator for generating a redundancy repair signal that indicates an address of the defective memory cell row; and a row decoder for receiving a row address signal that indicates a memory cell row including a memory cell to be accessed and selecting the redundant memory cell row in accordance with the redundancy repair signal generated by the redundancy repair signal generator;

wherein the redundancy repair signal generator is located opposite to the row decoder with the memory cell array sandwiched between the row decoder and the redundancy repair signal generator.

2. The semiconductor memory according to claim 1, wherein a redundancy repair signal line for supplying the redundancy repair signal to the row decoder is arranged between the row decoder and the redundancy repair signal generator and extends across the memory cell array.

3. The semiconductor memory according to claim 2, further comprising a plurality of word lines arranged in the row direction for each of the memory cell rows so that the row decoder selects one row of the memory cell rows in accordance with the row address signal, wherein the redundancy repair signal line is located between adjacent word lines of the word lines.

4. The semiconductor memory according to claim 3, wherein the redundancy repair signal line and the word lines are formed in the same wiring layer.

5. The semiconductor memory according to claim 1, wherein the semiconductor memory is formed as a static random access memory (SRAM), the memory cell array and the row decoder are located inside a SRAM macro, and the redundancy repair signal generator is located outside the SRAM macro.

6. The semiconductor memory according to claim 1, wherein the row decoder selects the redundant memory cell row when the address of the memory cell row indicated by the row address signal is matched with the address of the defective memory cell row indicated by the redundancy repair signal.

7. The semiconductor memory according to claim 1, wherein the memory cell array is rectangular in shape, the row decoder faces one side of the memory cell array in a column direction, and the redundancy repair signal generator faces the other side of the memory cell array in the column direction.

8. The semiconductor memory according to claim 1, wherein the memory cells and the redundant memory cells are arranged in matrix form, and the semiconductor memory further comprises a column decoder for receiving a column address signal that indicates a memory cell column including the memory cell to be accessed and selecting the memory cell column indicated by the column address signal.

9. A semiconductor memory comprising:

first and second memory cell arrays, each of which comprises a plurality of memory cell rows and at least one redundant memory cell row for repairing a defective memory cell row of the memory cell rows that includes a defective memory cell, each of the memory cell rows comprising a plurality of memory cells arranged in a row direction, and the at least one redundant memory cell row comprising a plurality of redundant memory cells arranged in the row direction;

a redundancy repair signal generator for generating a redundancy repair signal that indicates an address of the defective memory cell row; and a row decoder for receiving a row address signal that indicates a memory cell row including a memory cell to be accessed and selecting the redundant memory cell row in accordance with the redundancy repair signal generated by the redundancy repair signal generator;

wherein the row decoder is located between the first memory cell array and the second memory cell array, and the redundancy repair signal generator is located opposite to the row decoder with the first memory cell array sandwiched between the row decoder and the redundancy repair signal generator.

10. The semiconductor memory according to claim 9, wherein a redundancy repair signal line for supplying the redundancy repair signal to the row decoder is arranged between the row decoder and the redundancy repair signal generator and extends across the first memory cell array.

11. The semiconductor memory according to claim 9, further comprising a plurality of word lines arranged in the row direction for each of the memory cell rows so that the row decoder selects one row of the memory cell rows in accordance with the row address signal, wherein each of the word lines extends across the first memory cell array, the row decoder, and the second memory cell array.

* * * * *